April 5, 1966 R. J. ERTMAN 3,244,983

CONTINUOUSLY TUNABLE DIRECT READING HIGH FREQUENCY CONVERTER

Filed March 6, 1963 3 Sheets-Sheet 1

INVENTOR.
ROBERT J. ERTMAN

BY T. L. Styner

ATTORNEY

CONTINUOUSLY TUNABLE DIRECT READING HIGH FREQUENCY CONVERTER

Filed March 6, 1963 3 Sheets-Sheet 2

| DECIMAL | | 0 | 1 | 2 | 3 | 4 | 5 | 6 | 7 | 8 | 9 |
|---|---|---|---|---|---|---|---|---|---|---|---|
| BINARY | FF 1 | 0 | 1 | 0 | 1 | 0 | 1 | 0 | 1 | 0 | 1 |
| | FF 2 | 0 | 0 | 1 | 1 | 0 | 0 | 1 | 1 | 0 | 0 |
| | FF 3 | 0 | 0 | 0 | 0 | 1 | 1 | 1 | 1 | 0 | 0 |
| | FF 4 | 0 | 0 | 0 | 0 | 0 | 0 | 0 | 0 | 1 | 1 |
Fig. 3
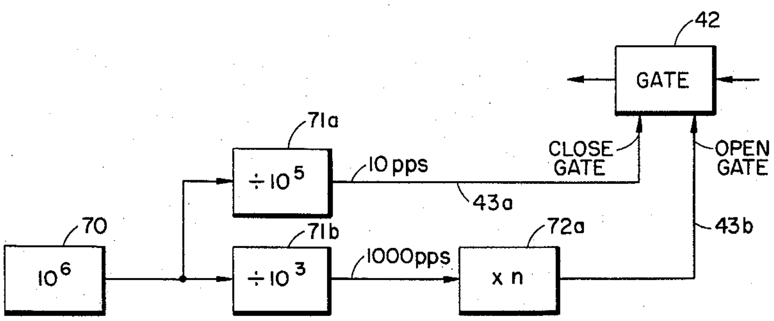
Fig. 4
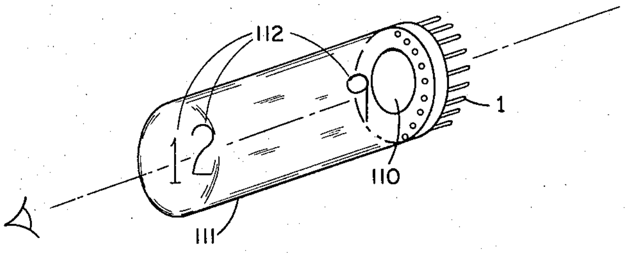
Fig. 5

United States Patent Office
3,244,983
Patented Apr. 5, 1966

3,244,983
CONTINUOUSLY TUNABLE DIRECT READING HIGH FREQUENCY CONVERTER

Robert J. Ertman, Rochester, N.Y., assignor to General Dynamics Corporation, Rochester, N.Y., a corporation of Delaware Filed Mar. 6, 1963, Ser. No. 263,149
10 Claims. (Cl. 325—455)

This invention relates to continuously tunable direct reading frequency converter systems and is particularly directed to means for tuning analog-fashion the converter circuits and for displaying on decimal number indicators the frequency of the signal being converted.

The need for many narrow signal channels in the broad tuning range of a heterodyne-type converter imposes serious restrictions on the allowable variations and drift of the local oscillator. Conventional analog-type tuning with ganged tuning condensers in the RF and local oscillators cannot select, for example, a 1 kc. signal in a 30 mc. range. Tuning dials cannot be calibrated sufficiently to accurately obtain such resolution even if the dials could be read by the operator. An alternative has been proposed comprising a crystal controlled oscillator and a frequency synthesizer with decimal dividers for digitally switching fixed condensers and/or coils. Such a system is expensive and lacks the desirable features of a continuously tunable circuit.

It is, accordingly, a prime object of this invention to provide an improved continuously tunable frequency converter circuit which has high ultimate resolution and can be easily read.

A further object of this invention is to provide a continuously tunable direct reading frequency converter with means for displaying decimal numbers indicative of the signal frequency to be converted.

Good oscillator stability and frequency readout accuracy are difficult to achieve at the higher frequencies. The tuning capacities of very high frequency (VHF) oscillators must be quite small and can approach the order of magnitude of the tube and stray capacities. The inevitable drift and variations in tube and stray capacities, therefore, have a considerable effect on the oscillator frequency.

It is, accordingly, a further object of this invention to provide an improved frequency converter system, the upper frequencies of which are not limited yet the local oscillator of which obviates the effects of uncontrollable capacities.

The objects of this invention are attained in a converter system, such as a heterodyne radio receiver, comprising a tunable RF amplifier, a mixer or first detector and a tunable locally generated source of injection frequencies. The local oscillator is of relatively low frequency and is followed by a frequency multiplier to obtain the desired high injection frequency for the mixer circuit. The oscillator frequency is sufficiently low to make the uncontrolled capacities relatively small compared to the tuning capacities. The low frequency local oscillator, the high frequency RF signal circuits and the multiplier tuning circuits are ganged to provide a constant intermediate frequency, IF, at the output of the mixer. The low frequency of the oscillator is also connected into a series of decimal counter units through a gate. The gate is closed a precisely measured period of time so that the counter content will be representative of the local oscillator frequency. The time basis is lengthened by a factor corresponding to the multiplication factor of the frequency multiplier so that the contents of the decimal counters are proportional to the receiver injection frequency. Visual displays of a series of decimal numbers are responsive to the binary coded decimal contents of the counter units. The counter is repetitively reset after each counting operation so that the display will follow manipulation of the tuning control. The counters are reset, not to zero, but to a number offset from zero, by the amount of the intermediate frequency of the receiver so that the displays show the signal frequency.

Other objects and features of this invention will become apparent to those skilled in the art by referring to the specific embodiments described in the following specification and shown in the accompanying drawings, in which:

FIG. 3 is a table of one logical circuit for converting binary coded numbers to decimal numbers;

FIG. 4 is a schematic circuit diagram of an alternative time base generator and gating system; and FIG. 5 is a partially exploded perspective view of one decimal number display unit usable in the system of FIG. 1.

Figure 1:
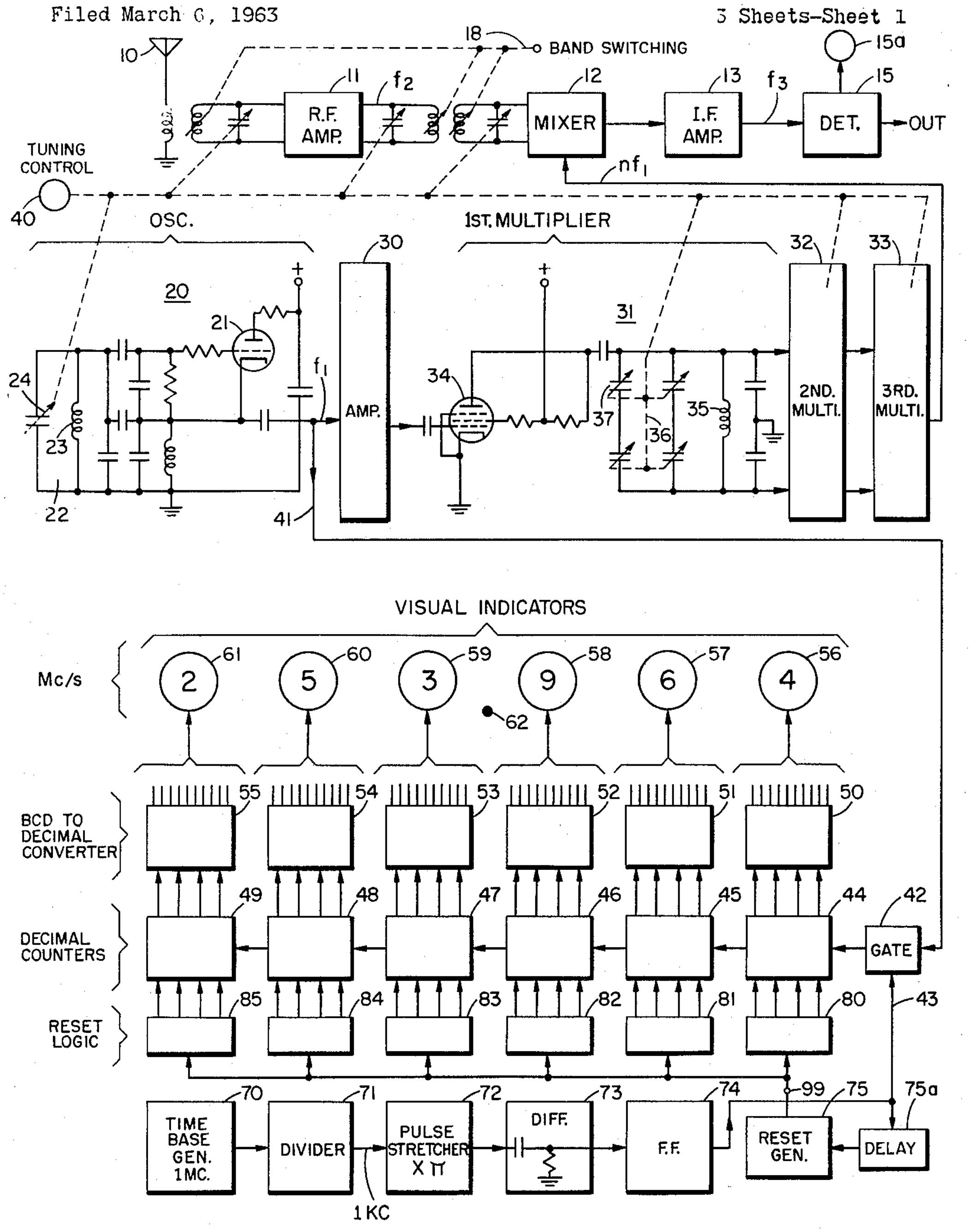
FIG. 1 is a circuit schematic, partly in block diagram, of one continuously tunable direct reading radio receiver embodying this invention.

The high-frequency converter shown in FIG. 1 is embodied in a radio receiver. The signal source may be the antenna 10 coupled to the radio frequency amplifier 11 and, hence, to the mixer or first detector 12 followed by the intermediate frequency amplifier 13 and the second detector 15. To the mixer 12 is applied a locally generated injection frequency, $nf_1$, which, when combined by addition or subtraction with the RF frequency, $f_2$, will produce the IF frequency, $f_3$. The local oscillator 20 comprises a Colpitts-type circuit including triode 21 and the tank circuit 22 coupled, as shown, between the input and output of the triode to produce self-sustained oscillations. The frequency determining circuit includes inductance 23 and condenser 24. The components, the biasing voltages, and the operating parameters of the oscillator are such as to produce a fundamental output frequency $f_1$. According to this invention, oscillator frequency $f_1$ is multiplied by the factor $n$ to obtain the desired injection frequency $nf_1$. The desired multiplication $n$ may be obtained in one or more cascaded multiplier stages. The frequency $f_1$ is preferably amplified at 30 before it is applied to the first multiplier 31, the second multiplier 32 and the third multiplier 33 being employed where the multiplication factor $n$ is particularly high. The multiplier exemplified at 31 comprises an overdriven pentode-type amplifier tube 34 with a balanced resonant output circuit including inductance 35 and tuning condensers 36 and 37. The resonant frequency of the output circuit of the multiplier is any selected integral multiple of the input frequency $f_1$. According to this invention, the multiplier tuning condensers are interlocked with the tuning condensers of the oscillator 20 so that as $f_1$ is varied, $nf_1$ is correspondingly varied. The tuning elements of the radio frequency circuits are also interlocked with the oscillator so that the receiver may thus be tuned to any desired signal frequency by the tuning control knob 40 attached to a common shaft for moving all of the tuning elements. The frequency indicated on the tuning control knob need be sufficient only to roughly indicate frequency. If it is desired to divide the signal frequency to be received into bands, gang control 18 may be employed to select the desired inductance for the selected band. A conventional tuning indicator 15*a* connected to the detector will show when a signal is received and when approximately the receiver is peaked.

To make the receiver useful to the operator, the signal frequency must be accurately indicated. For this purpose and according to an important feature of this invention, the output of the low frequency local oscillator is applied through conductor 41 to gate 42. The gate is closed, and then opened, during a precise interval of time by a control voltage on line 43. The gated single path through the gate 42 is connected into the cascaded series of decimal counter units. In the embodiment shown, there are six decimal counter units 44, 45, 46, 47, 48 and 49. Each decimal counter unit is capable of counting ten input pulses whereupon the next decimal counter unit is triggered. It follows that each decimal counter unit, 44–49, contains a coded decimal number, each number being succeedingly more significant from right to left. If the counter units are each reset to zero, and if, for example, the gate is open precisely one second, the cascaded counters will count up to and retain a number equal to the cycles per second of the local oscillator 20. One decimal counter unit is shown in detail in FIG. 2.

Each decimal counter unit, 44–49, FIG. 1, comprises a four-stage register with four output leads on which a binary coded decimal number will appear. The contents of each counter unit is decoded to one of ten decimal numbers, respectively, in conventional decoding circuits 50, 51, 52, 53, 54 and 55, one suitable binary-to-decimal conversion table being shown by way of example in FIG. 3. The ten output lines from each decoder are applied to a visual display device. The display devices are shown at 56, 57, 58, 59, 60 and 61. The display devices are physically arranged in order of significance from right to left so that the displayed numbers may be read directly without operator interpretation. The dot 62 may be painted on the front panel between the display devices to indicate to the operator the significance of the whole decimal number.

So that the numbers displayed will change rapidly as the receiver is tuned, the decimal counter units must be reset and the counting operation repeated at a rate determined by such factors as the persistence of vision and operating rates of the circuits. Resetting the counters is synchronized with the gate control voltage on line 43. The time base for gate control is generated by the stabilized fixed frequency generator 70 which operates at a frequency, the cyclic period of which is some decimal fraction, or multiple, of one second. It will be noted that the counter and display should have a resolution comparable to the resolving power of the resonant circuits to be tuned. If the tuning range extends over many megacycles and if the frequency selecting circuits cannot distinguish between increments of frequency less than, say, one kilocycle, then the least significant place of the decimal display, 56, need show no increment less than one kilocycle. In such a case, displays for 100 cycles or ten cycles would serve no useful purpose. Gate 42 must be closed for one millisecond to display a count of 1000 cycles. The divider 71, FIG. 1, should divide the wave from the time base generator 70 to produce a one kilocycle output. The period of the one kilocycle wave is one millisecond. According to this invention, the one millisecond time interval is then lengthened, as by pulse stretcher 72, by the factor $n$ so that the gate 42, which passes $f_1$, will remain closed to permit counting and display of the $nf_1$ frequency. According to the embodiment of FIG. 1, the time base wave is differentiated at 73 to produce sharp voltage spikes at the beginning and end of the measured time period. Such spikes will set and reset the flip-flop 74 according to the $n$ time base and the square wave on line 43 will precisely operate gate 42 for the desired time period.

After counting has been completed, all decimal counter units 44–49 must be reset. For this purpose, reset generator 75 is operated by the trailing edge of the pulse on line 43 to initiate the reset signal after the counting cycle. The reset generator 75 may be many forms of monostable devices, preferably with a suitable time delay element 75a, for delaying the reset pulse a measured time after completion of the count. The delay of the reset signal must take into consideration the desired visual display duty cycle and the time required for the counter units to settle before the start of the next counting operation.

In one system, the time base generator 70 was crystal-controlled and was adjustable to operate precisely at one megacycle. The divider 71 selected the thousandth submultiple of generator 70 to obtain accurate one millisecond time bases. Where the total multiplication factor $n$ of multipliers 31–33 was 9, the pulse stretcher 72 was adjusted to lengthen the time base to nine milliseconds. Any multiplication factor $n$ with a corresponding pulse stretcher could, of course, be employed.

An alternative time base control circuit for gate 42 is shown in FIG. 4. Here the one megacycle source 70 is divided by factors of $10^5$ and $10^3$, respectively, in dividers 71a and 71b. The outputs of the two dividers are then, respectively 10 pulses per second and 1000 pulses per second. Line 42a closes the gate and initiates ten complete counting and display operations each second. The duration of the 1000 p.p.s. cycle is lengthened in pulse stretcher 72a and is applied to control line 43b to open gate 42. Now the gate is repetitively opened and closed for periods of time to enable the counters 44–49 to count the $nf_1$ frequency.

According to another feature of this invention, provision is made for displaying numbers which may be directly read as the RF signal to which the receiver will respond. To this end, all or selected ones of the decimal counter units are reset, not to zero, but to a number displaced from zero, by the amount of the intermediate frequency. The IF can equal the sum of or the difference between the injection frequency and the RF signal. The reset pulse is applied to each stage of the four stages of each decimal counter to establish the desired combination of binary 0's and 1's for the desired decimal reset numbers. If the system might on occasion require a different IF, simple means may be employed for recoding new reset numbers. That is, means is provided for directing the reset pulse to different stages of the counter units. In FIG. 1, the reset pulse is applied to the counter units through reset logic circuits 80, 81, 82, 83, 84 and 85. Such reset logic may be effected by a simple patch board, referred to below in connection with FIG. 2. The frequency of operation of the receiver, $f_2$, will now be displayed on display devices 56 to 61.

Figure 2:
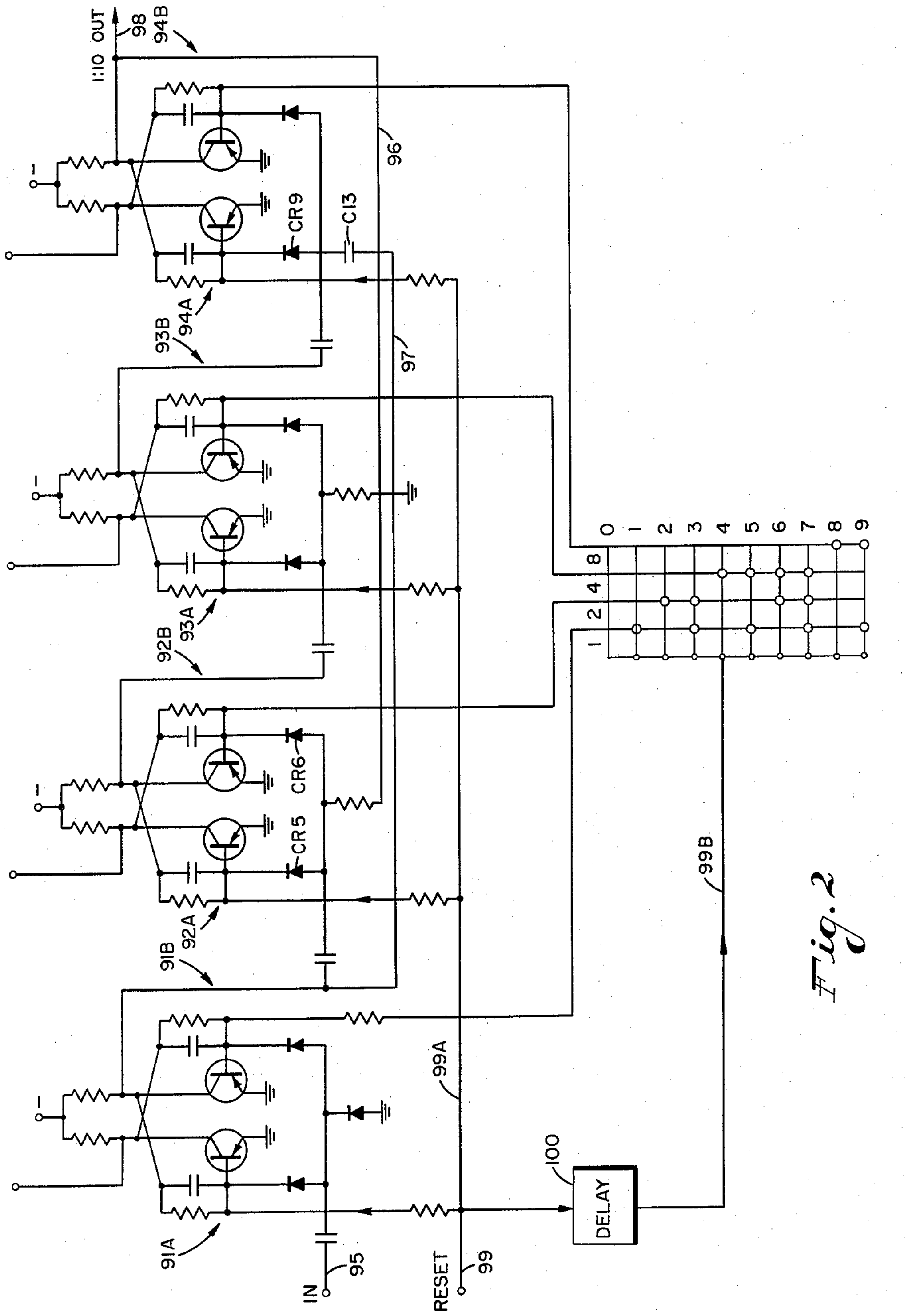
FIG. 2 is a schematic circuit diagram of one decimal counter unit employed in the receiver of FIG. 1.

Decimal counter units are well known in the art and many counting circuits are suitable in the system of this invention. Generally, four cascaded flip-flop, or "binary," stages are preferred with provision for recycling all stages through zero, and for applying an output pulse to the next succeeding counter, every tenth input pulse. FIG. 2 shows, by way of example, one four-stage binary counting unit which may be employed at each of the units 44–49 in FIG. 1. The counting unit shown comprises four flip-flops, each flip-flop comprising a pair of transistors. The transistor pairs are indicated at 91A and 91B, 92A and 92B, 93A and 93B, and 94A and 94B. The transistors are of the P-N-P type and in each stage the collector of one transistor is coupled to the input or base of the other transistor. In the idling or zero condition, the A transistors are normally cut off and the B transistors are normally conducting at saturation current. A positive-going trigger pulse at input terminal 95 is applied through the diodes of the steering circuit to each base to reverse the stable state of the flip-flop regardless of its history. Further, the coupling between the B transistor of one stage and the input steering circuit of the next flip-flop is through a coupling condenser. The diodes in the steering circuit are so polarized that the stage responds only to positive-going trigger pulses. So that all stages will reset to zero upon the tenth input pulse at terminal 95, the collector of transistor 94B is connected through line 96 to the steering circuit of stage 92, and the base of transistor 94A is connected to the output of stage 91 through line 97. In operation, the eighth input pulse flips 91, and 91B saturates producing a negative-going output pulse which causes 92B to saturate. The output pulse from 92B flips the third stage and 93B saturates. The output pulse from 93B flips the fourth stage and transistor 94B cuts off. The resulting negative voltage at the collector of 94B is applied to the diodes of the steering circuit of stage 92 and inhibits further input to stage 92. The ninth input pulse at terminal 95 causes stage 91 to flip, no output from 91B results. The tenth input pulse flips stage 91, and 91B saturates; but, the output signal from 91B is blocked from the second stage 92 by the closed gates CR5 and CR6. The output pulse of 91B instead goes through C13 and CR9 to flip the fourth stage. This means that 94B saturates producing an output pulse from 94B on output terminal 98, which is the result desired. Now, all stages are in the zero stable state and are ready for the next series of ten input pulses.

In those cases where the counter units have stopped at some count other than zero, and some of the four stages will stand in the stable "1" state, the reset pulse at terminal 99 may be applied to all A transistors to reset all stages to "0."

Where it is desired to reset selected stages not to "0" but to "1," the reset pulse is applied to the base of the B transistor of the selected stage. In the embodiment shown in FIG. 2, it is preferred that the B stages be selectively coupled to the reset pulse source through some sort of quick connect cross-bar grid or patch board as shown at 80. If a single reset pulse is to be employed for resetting the flip-flops first to "0" and then to "1," a short time delay, by delay device 100, is required.

In the embodiment of FIG. 2, all flip-flops can be reset to "0" by a negative potential pulse applied to the A transistors through line 99A, or by a negative pulse applied to the B transistors through line 99B. The duration of the reset pulse, it is found, should be at least twenty microseconds to insure resetting and settling of all stages of each counter unit. The reset information, as explained above, is obtained from the reset generator 75, in FIG. 1, the reset operations being delayed, in delay device 75*a*, to permit display.

Assume now that it is desired to reset some of the four stages of FIG. 2 to "1" instead of to "0," so that the four place binary output corresponds to some decimal number other than zero. That is, let it be assumed that a number is to be added to the readout results corresponding, in the example illustrated, to the IF, so that the readout shows $f_2$. For convenience in selecting the binary number to which each counter unit will reset, the patch boards 80 to 85 may be employed. Board 80 shown in FIG. 2 comprises four parallel conductors connected to the counter and with ten parallel conductors at right angles thereto connected to the reset source. The right-angle conductors are not in contact at the crossover points, but are provided with pinholes and metal pins to easily electrically connect the conductors at any crossover point. For example, by connecting the first and third binary reset leads with the horizontal conductors reset source, the counter will be reset to 1, 0, 1, 0 which, in the code of FIG. 3, means the decimal "5." Referring to FIG. 1, let it be assumed that the intermediate frequency is 27,000 kc. and that the injection frequency is substracted from the RF input to the mixer. This means that the decimal counters 48 and 47 must reset to 7 and 3, respectively, while the remaining counters reset to 0. Note that 73 is the complement of 27. If for any reason the IF is changed, the reset patch board facilitates shifting to the new IF.

Display devices may be of many types for visually displaying a decimal number in response to any one of the ten outputs of the binary-to-decimal converters 50–55. In FIG. 5 is shown a gas-filled cold cathode glow tube comprising the anode 110 at the base end of the envelope 111 and with a stack of wire-formed cathodes 112. Each of the ten cathodes is formed in the shape of a decimal number and is supported insulatingly from the remaining wires and is individually connected to terminal pins 113 on the base. The ten terminal pins, aside from the ground pin, are connected to the ten output terminals of each of the binary-to-decimal converters 50–55. Only the cathode which glows can be seen from the end of the envelope. One commercially obtainable display tube of this type known as the "Nixie" is produced by the Burroughs Corporation, Electronic Components Division, Plainfield, New Jersey.

Whereas conventional tuning dials with tuning indicators are incapable of accuracies greater than +1%, the decimal number displays of this invention are capable of accuracies of +.001%.

What is claimed is:

1. In combination in a tunable carrier wave receiver, a mixer with a fixed frequency intermediate frequency bandpass, a tunable circuit for radio frequencies feeding into said mixer, a tunable local oscillator, a tunable multiplier circuit coupled to said oscillator for generating a fixed multiple of the oscillator frequency, means for injecting the multiplied frequency into said mixer along with the radio frequency, means for tracking the tuning elements of the radio frequency circuits, the oscillator circuits and the multiplier circuits for generating said fixed intermediate frequency, and a frequency indicator comprising a series of decimal counter units connected in cascade, a gate coupling said decimal counter units to said oscillator, a time base generator for generating a time base decimally related to one second, and means coupled between said time base generator and said gate for multiplying the duration of said measured decimal fraction by a factor equal to the multiplication factor of said multiplier so that said decimal counter units will count at the rate of the injection frequency.

2. The receiver defined in claim 1 further comprising decimal number display devices coupled, respectively, to said decimal counter units, means for repetitively opening and closing said gate, and means for repetitively resetting said decimal counter units so that said display devices show new frequencies as said receiver is tuned.

3. The receiver defined in claim 1 further comprising decimal number display devices coupled, respectively, to said decimal counter units, means for repetitiously resetting said decimal counter units to numbers displaced from zero by an amount corresponding to said intermediate frequency so that said displays show said radio frequencies.

4. A frequency converting system comprising a mixer having a fixed bandpass characteristic, a first tunable source and a second tunable source connected to said mixer, interlock means for tracking said source to produce a signal of the passband of said mixer, a tuning indicator comprising a series of cascaded decimal counter units, a gate connected between said first source and said series of counter units, a time base generator for generating a decimal multiple or submultiple of one second, said generator being coupled to the control circuit of said gate, and means for setting into said decimal counter units a number corresponding to said passband frequency so that the number counted corresponds to the frequency of said second source.

5. A frequency converting system comprising a mixer for combining signal frequencies of a first and a second source to produce a predetermined single mixer product, means for counting the undulations of said first source throughout a decimal multiple or submultiple of one second to produce a count representative of the cycles per second of said one source, and means for setting in said counter means a number corresponding to the cycles per second of said predetermined mixer product so that the number counted corresponds to the frequency of said second source.

6. A frequency converting system comprising a mixer for combining the output of a first and of a second frequency source to produce a predetermined mixer product, means for counting the undulations of one source, a gate with a control circuit and having a signal circuit connected between said one source and said means for counting, means coupled to said control circuit for closing said gate a measured fraction or multiple of one second, said means including a stabilized time base generator, a decimal divider device coupled to said generator, a pulse stretcher coupled to said divider, and a reset generator responsive to the stretched pulse coupled to said counter for resetting said counter units.

7. A frequency converting system comprising a mixer, a first tunable signal source, a second tunable signal source of frequency $f_1$, a tunable frequency multiplier coupled between said second source and said mixer for multiplying said second source frequency $f_1$ by the factor of $n$, interlock means for tracking the tuning elements of said sources and said multiplier, and a tuning indicator system comprising a series of cascaded decimal counters, a gate with a signal circuit connected between said second source and said counter units, a time base generator for generating a time base voltage corresponding to some decimal fraction or multiple of one second, and means for lengthening the duration of said time base voltage by a factor of $n$, and means for applying the lengthened time base voltage to the control circuit of said gate so that said counter units will count a number during the interval of said lengthened voltage corresponding to $nf_1$.

8. The system defined in claim 7 further comprising a reset generator responsive to the gate circuit for resetting said counter units, and reset logic circuits connected between said reset generator and said counter units for resetting selected stages of selected counter units to binary numbers corresponding to the decimal equivalent of the frequency of said first source.

9. A heterodyne receiving system comprising a source of radio frequency $f_2$, a tunable local oscillator for generating a frequency $f_1$, a frequency multiplier coupled to said oscillator for generating the frequency $nf_1$, a mixer for combining said $f_2$ and $nf_1$ frequencies to produce a fixed intermediate frequency $f_3$, a series of cascaded decimal counter units, a gate with a signal circuit connected between said oscillator and the least significant counter unit of said series, each counter unit comprising a four-stage binary counting register, a binary coded decimal-to-decimal converter coupled to the four stages of each counter unit, and a decimal number display device connected to the output of each converter, a time base generator coupled to the control circuit of said gate for opening said gate a predetermined decimal multiple or submultiple of one second, a pulse stretcher means in said control circuit for lengthening the closed gate condition by the factor $n$ so that said display devices show decimal numbers corresponding to the frequency $nf_1$.

10. The system defined in claim 9 further comprising reset logic means responsive to said control circuit for resetting said counter units to numbers corresponding to said intermediate frequency $f_3$ so that said display devices show decimal numbers corresponding to said radio frequency $f_2$.

Ne references cited.

ROBERT H. ROSE, *Primary Examiner.*

R. LINN, *Assistant Examiner.*